United States Patent
Song et al.

(10) Patent No.: US 9,971,197 B2
(45) Date of Patent: May 15, 2018

(54) LIGHT SOURCE MODULE, BACKLIGHT ASSEMBLY INCLUDING THE SAME, AND DISPLAY DEVICE INCLUDING THE LIGHT SOURCE MODULE

(71) Applicant: SAMSUNG DISPLAY CO., LTD., Yongin, Gyeonggi-do (KR)

(72) Inventors: Si Joon Song, Suwon-si (KR); Hyuk Hwan Kim, Hwaseong-si (KR); Hyun Jeong Kim, Hwaseong-si (KR); Seok Hyun Nam, Seoul (KR); Young Keun Lee, Suwon-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 376 days.

(21) Appl. No.: 14/283,917

(22) Filed: May 21, 2014

(65) Prior Publication Data
US 2015/0219966 A1 Aug. 6, 2015

(30) Foreign Application Priority Data

Feb. 5, 2014 (KR) .................. 10-2014-0013175

(51) Int. Cl.
*G09F 13/04* (2006.01)
*G09F 13/08* (2006.01)
(Continued)

(52) U.S. Cl.
CPC ........ *G02F 1/133611* (2013.01); *F21V 5/046* (2013.01); *F21V 7/0066* (2013.01); *F21V 7/04* (2013.01); *F21V 13/04* (2013.01); *F21V 23/004* (2013.01); *G02B 19/0028* (2013.01); *G02B 19/0061* (2013.01); *G02B 19/0071* (2013.01); *G02F 1/133603* (2013.01); *G02F 1/133605* (2013.01); *G02F 1/133606* (2013.01); *H05K 1/0274* (2013.01); *F21Y 2115/10* (2016.08); *G02F 2001/133607* (2013.01);
(Continued)

(58) Field of Classification Search
CPC ........ G02F 1/133611; G02F 1/133603; G02F 1/133605; F21V 7/0066; F21V 13/04; F21V 13/045; F21V 5/046; H05K 1/0274; H05K 2201/2054; F21S 48/24
See application file for complete search history.

(56) References Cited

U.S. PATENT DOCUMENTS 9,683,715 B2 * 6/2017 Min ........................ F21V 5/04
9,683,719 B2 * 6/2017 Takatori ............ G02F 1/133603
(Continued)

FOREIGN PATENT DOCUMENTS

JP 2009004198 A 1/2009
JP 2010074179 A 4/2010
(Continued)

*Primary Examiner* — William N Harris
(74) *Attorney, Agent, or Firm* — Cantor Colburn LLP

(57) ABSTRACT

A light source module includes a printed circuit board including a wiring layer, an insulating coating layer disposed on the wiring layer, and a reflection adjustment pattern disposed on the insulating coating layer and having reflection characteristics which are different from reflection characteristics of the insulating coating layer, a light emitting chip mounted on the printed circuit board, and an optical lens arranged on an upper portion of the light emitting chip and fixed to the printed circuit board.

11 Claims, 16 Drawing Sheets

(51) Int. Cl.
*G02F 1/1335* (2006.01)
*F21V 5/04* (2006.01)
*F21V 7/00* (2006.01)
*F21V 7/04* (2006.01)
*F21V 13/04* (2006.01)
*H05K 1/02* (2006.01)
*G02B 19/00* (2006.01)
*F21Y 115/10* (2016.01)
*F21V 23/00* (2015.01)
*F21V 23/04* (2006.01)

(52) U.S. Cl.
CPC .............. *H05K 2201/10106* (2013.01); *H05K 2201/10121* (2013.01); *H05K 2201/2054* (2013.01)

(56) References Cited

U.S. PATENT DOCUMENTS

| | | |
|---|---|---|
| 2008/0101086 A1 | 5/2008 | Lee |
| 2009/0213571 A1 | 8/2009 | Jin et al. |
| 2011/0309405 A1 | 12/2011 | Lee |
| 2012/0102798 A1 | 5/2012 | Oki |
| 2012/0206673 A1* | 8/2012 | Ogata ................ G02F 1/133603 349/69 |
| 2013/0070170 A1* | 3/2013 | Namekata .......... G02F 1/133603 348/836 |
| 2013/0188100 A1* | 7/2013 | Ikuta .......................... G02F 1/00 348/739 |
| 2014/0321127 A1* | 10/2014 | Chang ................ G02F 1/133603 362/308 |
| 2015/0109559 A1* | 4/2015 | Lee .................... G02F 1/133606 349/67 |
| 2015/0159834 A1* | 6/2015 | Chang ................ G02F 1/133606 362/97.1 |
| 2015/0260371 A1* | 9/2015 | Takatori ............ G02F 1/133603 362/97.1 |

FOREIGN PATENT DOCUMENTS

| | | |
|---|---|---|
| KR | 100601461 B1 | 7/2006 |
| KR | 101295358 B1 | 8/2013 |

* cited by examiner

LIGHT SOURCE MODULE, BACKLIGHT ASSEMBLY INCLUDING THE SAME, AND DISPLAY DEVICE INCLUDING THE LIGHT SOURCE MODULE

This application claims priority to Korean Patent Application No. 10-2014-0013175, filed on Feb. 5, 2014, and all the benefits accruing therefrom under 35 U.S.C. § 119, the disclosure of which is incorporated herein in its entirety by reference.

BACKGROUND

1. Field of the Invention

The invention relates to a light source module, a backlight assembly including the same, and a display device including the light source module.

2. Description of the Prior Art

A liquid crystal display ("LCD") is a display device, in which liquid crystals are injected between two glass substrates, and the molecular orientation of the liquid crystals for each pixel is changed through application of a power to upper and lower glass substrate electrodes to display an image. Unlike a cathode ray tube ("CRT") or a plasma display panel ("PDP"), the LCD is not self-luminous, and thus is unable to be used in a place where no light source is provided. In order to supplement such drawbacks, a backlight assembly for uniformly emitting light onto an information display surface is mounted to enable the LCD to be used even in a dark place.

The backlight assembly generally includes a light source module, a diffusion plate, and optical sheets. The light source module of the backlight assembly may include light emitting diode ("LED") light sources having superior efficiency. In a direct type backlight assembly, optical lenses are arranged on upper portions of the LED light sources to heighten diffusibility of light emitted from the LED light sources.

SUMMARY

Light that is emitted from an upper portion of a light emitting diode ("LED") light source is diffused through an optical lens. However, when light that is emitted from a side portion or a lower portion of the LED light source is reflected by a printed circuit board ("PCB") and is incident to the optical lens, the incident light is refracted in an upper direction, and a large amount of light may be concentrated just above the LED light source to cause luminance non-uniformity to occur. When the luminance of the light that is emitted from the light source module becomes non-uniform, the light quality of the backlight that includes the light source module and the display quality of the display device may be deteriorated.

Accordingly, exemplary embodiments of the invention provide a light source module with improved luminance uniformity.

Another exemplary embodiment of the invention provides a backlight assembly with improved light quality.

Another exemplary embodiment of the invention provides a display device with improved display quality.

In one exemplary embodiment of the invention, there is provided a light source module including a PCB including a wiring layer, an insulating coating layer disposed on the wiring layer, and a reflection adjustment pattern disposed on the insulating coating layer and having reflection characteristics that are different from reflection characteristics of the insulating coating layer, a light emitting chip mounted on the PCB, and an optical lens arranged on an upper portion of the light emitting chip and fixed to the PCB.

In an exemplary embodiment, the reflection adjustment pattern may be arranged to surround a periphery of the light emitting chip in a plan view.

In an exemplary embodiment, the reflection adjustment pattern may be in a closed curve shape having a predetermined width between an outer line of the closed curve shape and an inner line of closed curve shape in the plan view.

In an exemplary embodiment, the reflection adjustment pattern may include a first reflection adjustment pattern member and a second reflection adjustment pattern member that is positioned on an outer side than the first reflection adjustment pattern.

In an exemplary embodiment, the reflection adjustment pattern may include a plurality of sub-reflection adjustment patterns that are spaced apart from each other, and the respective sub-reflection adjustment patterns are arranged along a closed curve.

In an exemplary embodiment, the reflection adjustment pattern may be spaced apart from the light emitting chip, and the insulating coating layer may be exposed in a gap space between the reflection adjustment pattern and the light emitting chip.

In an exemplary embodiment, a lower groove may be defined in a center portion of the optical lens and a bottom surface portion of the optical lens may be positioned around the lower groove, and the reflection adjustment pattern may be positioned on an inner side of a corner of an inside of the bottom surface portion of the optical lens.

In an exemplary embodiment, a lower groove may be defined in a center portion of the optical lens and a bottom surface portion of the optical lens may be positioned around the lower groove, and the reflection adjustment pattern may be extended up to a lower portion of the bottom surface portion of the optical lens through the corner of the inside of the bottom surface portion of the optical lens.

In an exemplary embodiment, the reflection adjustment pattern may have a reflection rate that is lower than a reflection rate of the insulating coating layer.

In an exemplary embodiment, the reflection adjustment pattern may have a color that is different from a color of the insulating coating layer.

In an exemplary embodiment, a surface of the insulating coating layer may be white, and a surface of the reflection adjustment pattern may be black, blue, dark blue, or bluish green.

In other exemplary embodiment of the invention, there is provided a backlight assembly including a receptacle, a PCB arranged on the receptacle and including a wiring layer, an insulating coating layer disposed on the wiring layer, and a reflection adjustment pattern disposed on the insulating coating layer and having reflection characteristics that are different from reflection characteristics of the insulating coating layer, a light emitting chip mounted on the PCB, an optical lens arranged on an upper portion of the light emitting chip and fixed to the PCB, a reflection sheet arranged on an upper portion of the receptacle and an opening defined in the reflection sheet and into which the optical lens is inserted.

In an exemplary embodiment, the PCB may be disposed in a bar type.

In an exemplary embodiment, the reflection adjustment pattern may be arranged to surround a periphery of the light emitting chip.

In an exemplary embodiment, the reflection adjustment pattern may be in a closed curve shape having a predetermined width.

In an exemplary embodiment, the reflection adjustment pattern may be spaced apart from the light emitting chip, and the insulating coating layer may be exposed in a gap space between the reflection adjustment pattern and the light emitting chip.

In an exemplary embodiment, the reflection adjustment pattern may have a reflection rate that is lower than a reflection rate of the insulating coating layer.

In an exemplary embodiment, the reflection adjustment pattern may have a color that is different from a color of the insulating coating layer.

In another exemplary embodiment of the invention, there is provided a display device including a receptacle, a PCB arranged on the receptacle and including a wiring layer, an insulating coating layer disposed on the wiring layer, and a reflection adjustment pattern disposed on the insulating coating layer and having reflection characteristics that are different from reflection characteristics of the insulating coating layer, a light emitting chip mounted on the PCB, an optical lens arranged on an upper portion of the light emitting chip and fixed to the PCB, a reflection sheet arranged on an upper portion of the receptacle and an opening defined in the reflection sheet and into which the optical lens is inserted, an optical sheet arranged on an upper portion of the reflection sheet, and a display panel arranged on an upper portion of the optical sheet.

In an exemplary embodiment, the PCB may be provided in a bar type, and the reflection adjustment pattern may be arranged to surround a periphery of the light emitting chip, and may be in a closed curve shape.

According to the exemplary embodiments of the invention, at least the following effects can be achieved.

That is, the amount and/or the color of the light that is refracted to the upper portion of the LED chip can be controlled by the reflection adjustment pattern disposed on the PCB. Accordingly, the luminance uniformity can be improved and the color purity can be improved.

Further, the light quality of the backlight assembly including the LED chip can be improved, and thus the display quality of the display device can be improved.

The effects according to the invention are not limited to the contents as exemplified above, but further various effects are included in the description.

BRIEF DESCRIPTION OF THE DRAWINGS

The above and other objects, features and advantages of the invention will be more apparent from the following detailed description taken in conjunction with the accompanying drawings, in which.

DETAILED DESCRIPTION

Figure 1:
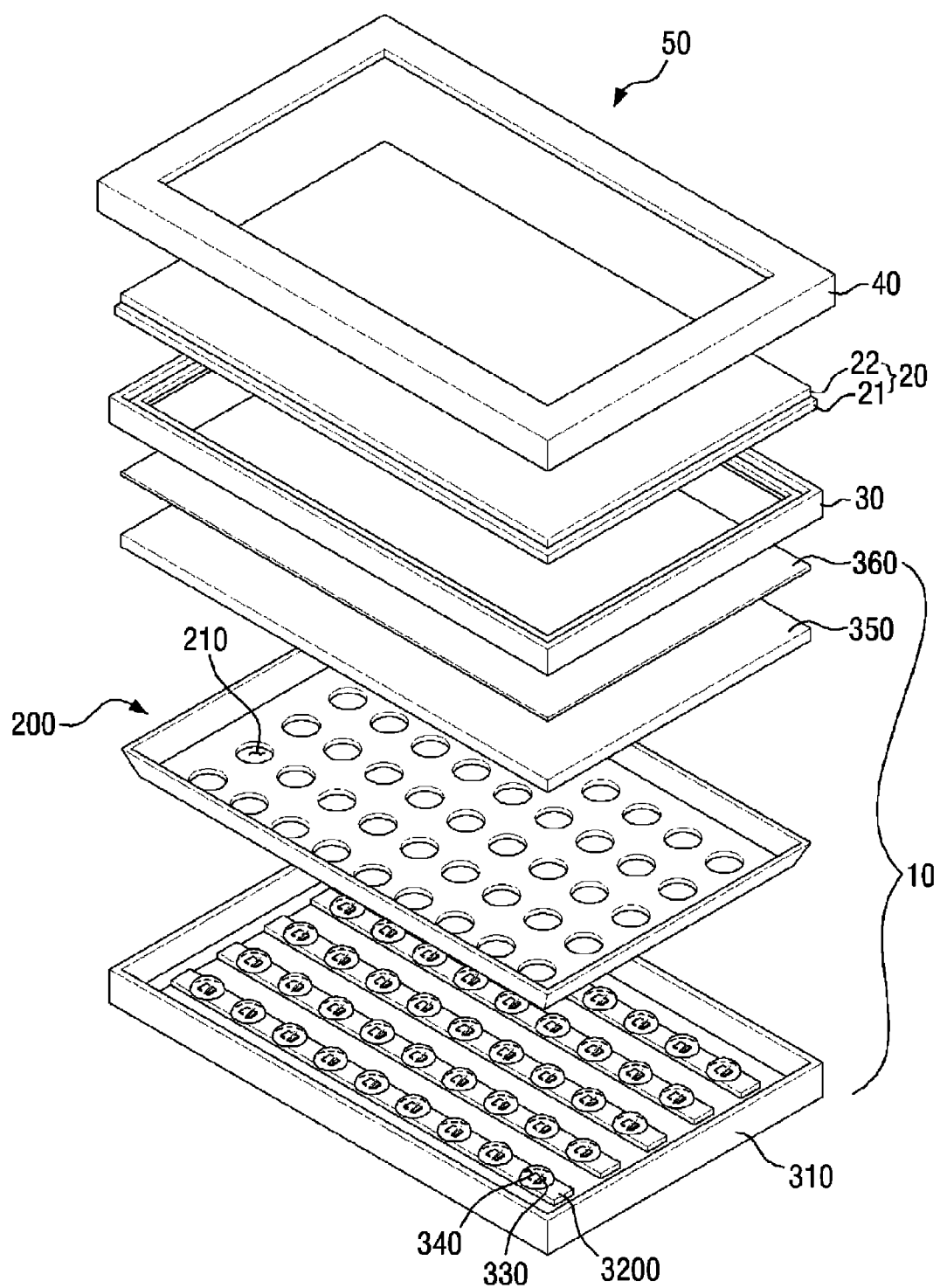
FIG. 1 is an exploded perspective view of an exemplary embodiment of a display device according to the invention.

Advantages and features of the invention and methods of accomplishing the same may be understood more readily by reference to the following detailed description of preferred embodiments and the accompanying drawings. The invention may, however, be embodied in many different forms and should not be construed as being limited to the embodiments set forth herein. Rather, these embodiments are provided so that this invention will be thorough and complete and will fully convey the concept of the invention to those skilled in the art, and the invention will only be defined by the appended claims.

It will also be understood that when a layer is referred to as being "on" another layer or substrate, it can be directly on the other layer or substrate, or intervening layers may also be present. The same reference numbers indicate the same components throughout the specification.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the invention.

The terminology used herein is for the purpose of describing particular embodiments only and is not intended to be limiting. As used herein, the singular forms "a," "an," and "the" are intended to include the plural forms, including "at least one," unless the content clearly indicates otherwise. "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10%, 5% of the stated value.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Hereinafter, embodiments of the invention will be described with reference to the accompanying drawings.

FIG. 1 is an exploded perspective view of a display device according to an exemplary embodiment of the invention.

Referring to FIG. 1, a display device 50 according to an exemplary embodiment of the invention includes a display panel 20 and a backlight assembly 10 arranged on a lower portion of the display panel 20.

The display panel 20 may include an upper display plate 22 and a lower display plate 21, which face each other. In an exemplary embodiment, the upper display plate 22 and the lower display plate 21 may be combined with each other by a sealing material (not illustrated). In an exemplary embodiment, a liquid crystal layer (not illustrated) may be interposed between the upper display plate 22 and the lower display plate 21. In an exemplary embodiment, a polarizing sheet (not illustrated) may be attached to an outside of the upper display plate 22 and the lower display plate 21.

In an exemplary embodiment, a plurality of pixel electrodes, wirings for driving the pixel electrodes, and switching devices may be disposed on the lower display plate 21. In an exemplary embodiment, a common electrode may be provided on the upper display plate 22 or the lower display plate 21 to apply an electric field to the liquid crystal layer. In an exemplary embodiment, a color filter and a black matrix may be disposed on the upper display plate 22 or the lower display plate 21.

The backlight assembly 10 may include a lower receptacle 310, a light source module, a reflection sheet 200, an optical plate 350, and an optical sheet 360.

The lower receptacle 310 receives the light source module, the reflection sheet 200, the optical plate 350, and the optical sheet 360 therein. In an exemplary embodiment, the lower receptacle 310 may be a bottom chassis. In an exemplary embodiment, the lower receptacle 310 may include a recess portion (not illustrated) in which the light source module is arranged.

The light source module provides light to the display panel 20. The light source module may include a plurality of light sources. In an exemplary embodiment, the light source may include a point light source. In the exemplary embodiment, the point light source may include an LED light source. In an exemplary embodiment, the LED light source may include an LED chip 330 that is a light emitting chip and an optical lens 340 that diffuses the emitted light.

The LED chip 330 may be mounted on the substrate. The substrate on which the LED chip 330 is mounted may be a bar-type printed circuit board ("PCB") 3200. A plurality of LED chips 330 may be arranged on the PCB 3200. On each LED chip 330, an optical lens 340 may be arranged. The optical lens 340 may function to diffuse the light that is emitted from the LED chip 330. The light source module may be provided with a plurality of bar-type PCBs 3200 on which a plurality of LED chips 330 is mounted. The numbers of LED chips 330 mounted on the respective PCBs 3200 may be equal to each other or may be different from each other. The respective PCBs 3200 on which the LED chips 330 are mounted may be arranged in parallel to each other. The respective PCBs 3200 may be arranged in the recess portion of the lower receptacle 310. The light source module will be described in more detail later.

The reflection sheet 200 serves to reflect light that is directed to the lower side to the upper side. In an exemplary embodiment, the reflection sheet 200 may be connected as a whole. Openings 210 may be defined in the reflection sheet 200. In an exemplary embodiment, a number of openings 210 may be equal to a number of LED chips 330. In an exemplary embodiment, a diameter or a size of the opening 210 may be larger than an outer diameter or a size of the optical lens 340.

On an upper portion of the light source module, the optical plate 350 and/or the optical sheet 360 may be arranged as optical modulation structures that modulate light. In an exemplary embodiment, the optical plate 350 may be a diffusion plate. The optical sheet 360 may be a prism sheet, a diffusion sheet, a micro lens sheet, a lenticular sheet, a phase different compensation sheet, or a reflective polarizing sheet. A plurality of optical sheets 360 may be used or one complex optical sheet, in which a plurality of optical modulation characteristics as exemplified above are implemented, may be used. Since various combinations of optical modulation structures are well known in the field, the detailed explanation thereof will be omitted.

The display panel 20 may be received in a middle receptacle 30. In an exemplary embodiment, the middle receptacle 30 may be a mold frame or a middle mold. The middle receptacle 30 may be fixedly fastened to the lower receptacle 310. The optical plate 350 and/or the optical sheet 360 may be received in the lower receptacle 310 or the middle receptacle 30. In the illustrated exemplary embodiment, the middle receptacle is provided in a rectangular frame. However, the invention is not limited thereto, and two bar-type middle receptacles may be provided and arranged on a long side or a short side of the display device.

An upper receptacle 40 may be arranged on the upper portion of the display panel 20. In an exemplary embodiment, the upper receptacle 40 may be a top chassis or a bezel. An open window is defined in the upper receptacle 40, and covers the border of the display panel 20 to protect the same. The upper receptacle 40 may be combined with the lower receptacle 310.

Hereinafter, the above-described optical module and PCB 3200 will be described in more detail.

Figure 2:
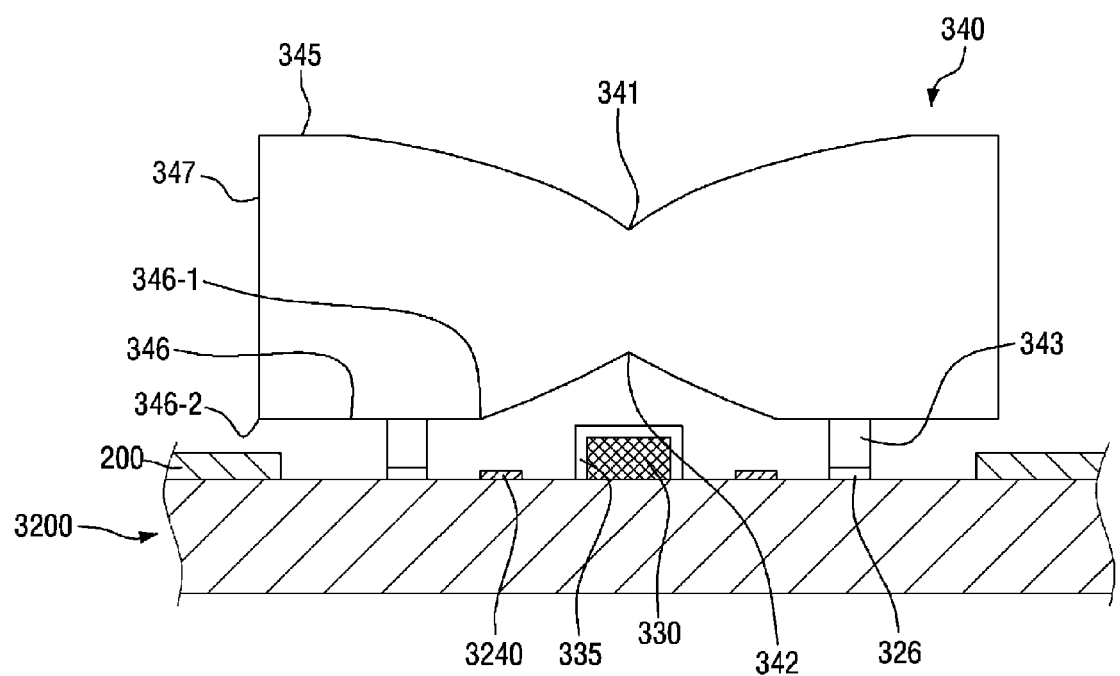
FIG. 2 is a partial cross-sectional view of an exemplary embodiment of a region in which a light source module is arranged in a display device according to the invention.
Figure 3:
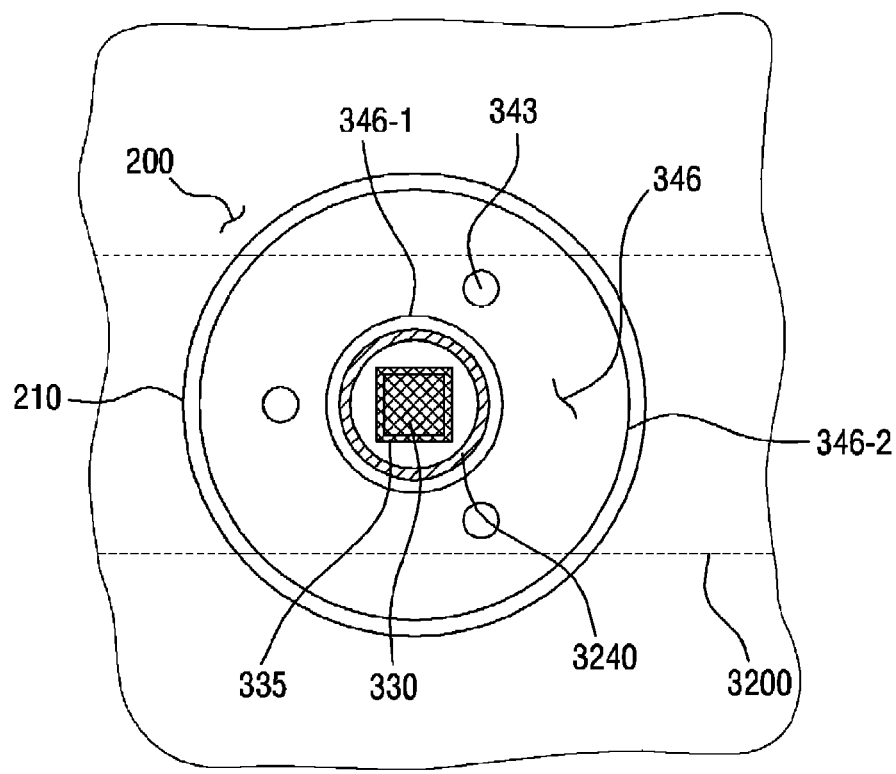
FIG. 3 is a plan view of a light source module of FIG. 2.

FIG. 2 is a partial cross-sectional view of a region in which a light source module is arranged in a display device according to an exemplary embodiment of the invention, and FIG. 3 is a plan view of a light source module of FIG. 2.

Referring to FIGS. 2 and 3, the light source module includes the PCB 3200, the LED chip 330, and the optical lens 340. Specifically, the LED chip 330 is mounted on the PCB 3200. In an exemplary embodiment, the LED chip 330 may be mounted on an electrode portion of the PCB 3200 by surface mount technology ("SMT"). The electrode portion of the PCB 3200, on which the LED chip 330 is mounted, may be defined through exposure of a wiring layer 322 (refers to FIG. 4).

In an exemplary embodiment, the LED chip 330 may include, for example, a blue light emitting element, a red light emitting element, and a green light emitting element to emit white light. In another exemplary embodiment, the LED chip 330 may include a blue light emitting element, and may be provided with fluorescent materials having red and green light emission peaks when a blue light is applied, or a fluorescent layer 335 including a fluorescent material having a yellow light emission peak to emit white light. In still another exemplary embodiment, the LED chip 330 may include a ultraviolet ("UV") light emitting element, and may be provided with a fluorescent layer 335 including fluorescent materials having red, green, and blue light emission peaks when a UV light is incident to emit white light. The fluorescent layer 335 may be arranged to cover not only an upper surface portion of the LED chip 330 but also a side surface portion thereof.

The optical lens 340 is arranged on the LED chip 330. The optical lens 340 may serve to diffuse light that is emitted from the LED chip 330. The optical lens 340 may include an upper surface portion 345, a bottom surface portion 346, and a side surface portion 347. The upper surface portion 345 of the optical lens 340 may include a substantially flat surface or a convex surface. In the center of an upper side of the optical lens 340, an upper groove 341 having a lower concave recessed shape may be defined. In the center of a lower side of the optical lens 340, a lower groove 342 having an upper concave recessed shape may be defined. The bottom surface portion 346 of the optical lens 340 may be positioned in the vicinity of the lower groove 342. The bottom surface portion 346 of the optical lens 340 may be substantially flat. The upper groove 341 and the lower groove 342 may be positioned on the center portion of the optical lens 340 and may be arranged to overlap each other in a plan view. Further, the LED chip 330 may also be positioned on the center portion of the optical lens 340 and may overlap the upper groove 341 and the lower groove 342 in a plan view.

The bottom surface portion 346 of the optical lens 340 may be substantially flat. The bottom surface portion 346 of the optical lens 340 may be substantially in parallel to the surface of the PCB 3200, but is not limited thereto. The bottom surface portion 346 of the optical lens 340 may be defined by an inner corner 346_1 that is adjacent to the lower groove 342 and an outer corner 346_2 that is adjacent to the side surface portion. In a plan view, the inner corner 346_1 and the outer corner 346_2 of the bottom surface portion 346 may have a concentric circle shape.

A lens support leg 343 may be disposed on the bottom surface portion 346 of the optical lens 340. The lens support leg 343 may be provided and attached separately from the bottom surface portion 346 of the optical lens 340, or may be unitary with the bottom surface portion 346 of the optical lens 340.

In an exemplary embodiment, the lens support leg 343 may be provided in a pillar shape. In the illustrated exemplary embodiment, three lens support legs 343 are provided. However, the invention is not limited thereto, and the number of lens support legs 343 may be four or more, or less than three. The bottom surface of the lens support leg 343 may be combined with the surface of the PCB 3200. In an exemplary embodiment, the bottom surface of the lens support leg 343 may be combined with the surface of the lower receptacle 310 through an adhesive layer 326. By the lens support leg 343, the optical lens 340 may be spaced apart from the LED chip 330 by a predetermined distance.

The LED chip 330 and the optical lens 340 may be combined with the PCB 3200 to be modularized. The LED chip 330 and the optical lens 340 are inserted into the opening 210 of the reflection sheet 200.

On the surface of the PCB 3200, a reflection adjustment pattern 3240 is provided. The reflection adjustment pattern 3240 may be provided along the circumference of the LED chip 330. The reflection adjustment pattern 3240 will be described in detail with reference to FIGS. 4 and 5.

Figure 4:
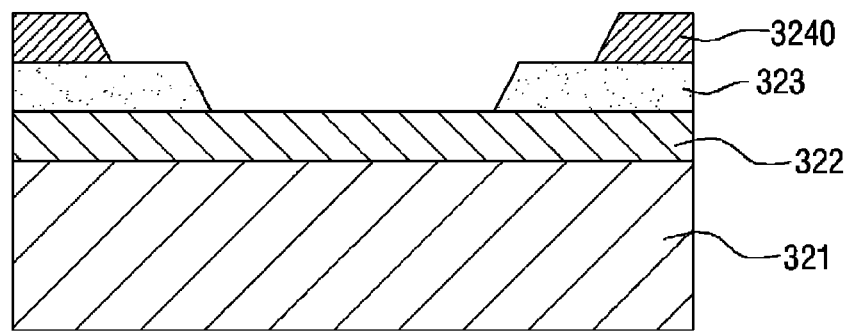
FIG. 4 is a cross-sectional view of a printed circuit board ("PCB") applied to the display device of FIG. 1.

FIG. 4 is a cross-sectional view of a PCB applied to the display device of FIG. 1.

Referring to FIG. 4, a PCB 3200 may include a base substrate 321, a wiring layer 322, insulating coating layers 323, and a reflection adjustment pattern 3240.

The base substrate 321 may be an insulating substrate or a conductive substrate. When the base substrate 321 is an insulating substrate, it may include epoxy resin, ceramic such as sapphire including aluminum oxide, or a combination of epoxy resin and ceramic. When the base substrate 321 is a conductive substrate, the base substrate 321 may include a metal material. However, the constituent materials of the base substrate 321 are not limited to those as exemplified above.

When the base substrate 321 includes an insulating material, the wiring layer 322 that includes a conductive material may be disposed on the base substrate 321. The wiring layer 322 may be a single layer or a multilayer. When the wiring layer is a multilayer, respective layers may be partially connected to each other through contacts (not illustrated).

In an exemplary embodiment, the wiring layer 322 may include copper or a copper alloy, but is not limited thereto. In an exemplary embodiment, the wiring layer 322 may include an electrode portion in electrical contact with the electrode of the LED chip 330.

The coating layer 323 that includes an insulating material may be disposed on the wiring layer 322. The insulating coating layer 323 generally covers the wiring layer 322 and/or the base substrate 321, but may expose the electrode portion that comes in contact with the electrode of the LED chip 330. In an exemplary embodiment, the insulating coating layer 323 may include a solder resist or photo solder resist material. In an exemplary embodiment, the surface of the insulating coating layer 323 may have a color having good reflection efficiency. In an exemplary embodiment, the surface color of the insulating coating layer 323 may be white, for example.

On the insulating coating layer 323, the reflection adjustment pattern 3240 may be provided. The reflection adjustment pattern 3240 may be disposed on only a part of the whole surface of the insulating coating layer 323. In an exemplary embodiment, the reflection adjustment pattern 3240 may include a material having different reflection characteristics from the insulating coating layer 323. In the exemplary embodiment, the different reflection characteristics include not only different reflection rates with respect to the total light quantity of incident light but also different reflection ratios by frequencies of incident light. In an exemplary embodiment, the reflection adjustment pattern 3240 may be provided, for example, in a silk printing method using silk ink. In another exemplary embodiment, the reflection adjustment pattern 3240 may include a solder resist or photo solder resist material.

For different reflection characteristics, the insulating coating layer 323 and the reflection adjustment pattern 3240 may have different colors. In an exemplary embodiment, when the insulating coating layer 323 is white and the reflection adjustment pattern 3240 is black, for example, the reflection rate of the reflection adjustment pattern 3240 may be lower than the reflection rate of the insulating coating layer 323 with respect to the incident light. In another exemplary embodiment, when the insulating coating layer 323 is white and the reflection adjustment pattern 3240 is blue, for example, the insulating coating layer 323 may reflect the whole frequency with respect to the light which is emitted from the LED chip 330 and is converted into white light through a phosphor layer 335, whereas the reflection adjustment pattern 3240 may absorb the frequencies corresponding to the remaining colors except for blue and may reflect only the frequency corresponding to blue. Using such a principle, it is possible to adjust color coordinates.

Figure 5:
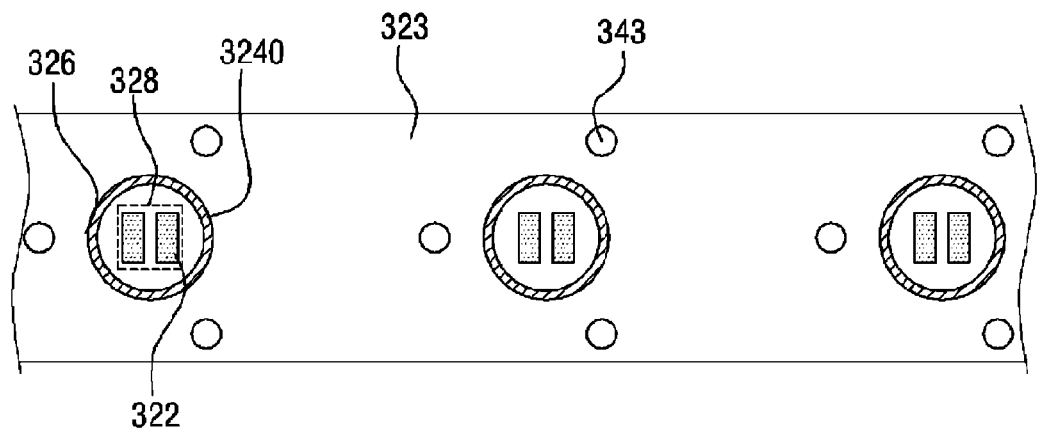
FIG. 5 is a plan view of an exemplary embodiment of a PCB of a display device according to the invention.

FIG. 5 is a plan view of a PCB of a display device according to an exemplary embodiment of the invention.

Referring to FIG. 5, in an exemplary embodiment, the PCB 3200 may be provided in a bar type. Mount portions 328 of a plurality of LED chips 330 is disposed on the PCB 3200. The respective mount portions 328 of the LED chips 330 may be spaced apart from each other by a predetermined distance. In an exemplary embodiment, the gap distance between the mount portions 328 of the LED chips 330 may be uniform, but the invention is not limited thereto.

An electrode portion is disposed on the center of the mount portion 328 of each LED chip 330. On the electrode portion, the insulating coating layer 323 is not provided, and the wiring layer 322 may be exposed.

The reflection adjustment pattern 3240 may be provided in the vicinity of the mount portion 328 of the LED chip 330. In an exemplary embodiment, the planar shape of the reflection adjustment pattern 3240 may be a closed curve having a predetermined width, for example, a circular band or a ring. The width of the reflection adjustment pattern 3240 may be 1 micrometer (μm) to 10 μm, but the invention is not limited thereto.

The reflection adjustment pattern 3240 may be provided to be spaced apart from the mount portion 328 of the LED chip 330 by a predetermined distance.

Referring to FIGS. 3 and 5, the reflection adjustment pattern 3240 may be arranged to be spaced apart from the LED chip 330 and the fluorescent layer 335 disposed on the surface of the LED chip 330 by a predetermined distance. Further, the reflection adjustment pattern 3240 may be outwardly spaced apart from the LED chip 330 and may be positioned on the inside of the inner corner 346_1 of the bottom surface portion 346 in a plan view. The reflection adjustment pattern 3240 may be arranged to be spaced apart from the bottom surface portion 346 of the optical lens 340 by a predetermined distance. That is, the reflection adjustment pattern 3240 may be arranged between the bottom surface portion 346 of the optical lens 340 and the LED chip 330.

Accordingly, the surface of the PCB 3200 on which the reflection adjustment pattern 3240 is not provided, that is, the insulating coating layer 323, may be exposed between the reflection adjustment pattern 3240 and the LED chip 330 and between the reflection adjustment pattern 3240 and the bottom surface portion 346 of the optical lens 340.

As described above, the reflection adjustment pattern 3240 has the reflection characteristics that are different from the reflection characteristics of the insulating coating layer 323 to adjust the reflection rate. This will be described in more detail with reference to FIGS. 6 and 7.

Figure 6:
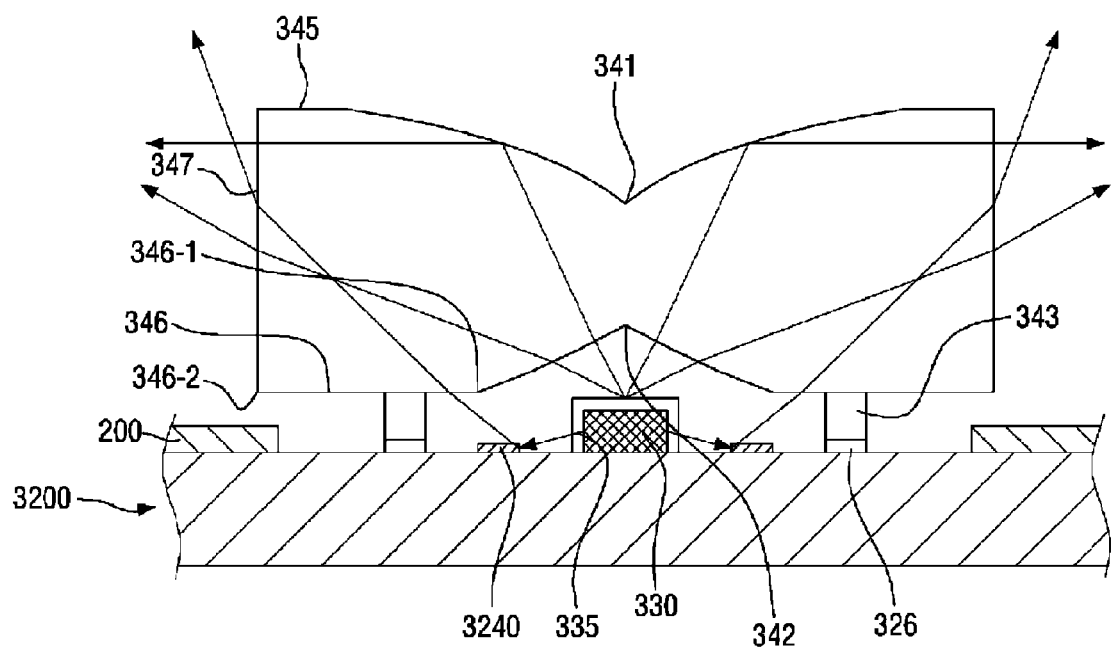
FIG. 6 is a schematic view illustrating an exemplary embodiment of a light traveling path in a light source module of a display device according to the invention.

FIG. 6 is a schematic view illustrating a light traveling path in a light source module of a display device according to an exemplary embodiment of the invention.

Referring to FIG. 6, the light, which is emitted from the LED chip 330 and is converted into white through the fluorescent layer 335, may be incident to the optical lens 340. An air layer is disposed between the LED chip 330 and the optical lens 340 and on the outside of the optical lens 340, and an optical interface may be disposed between the optical lens 340 and the air layer. On the optical interface, the light may be refracted, reflected, and/or totally reflected according to Snell's law to change its traveling direction. As a result, a large number of lights that are incident in the upper vertical direction change their traveling paths to the outside to be diffused.

A part of the light may be emitted horizontally or downwardly below the horizon. Further, a part of the light may be reflected by the optical lens 340 and may travel downwardly. When the light that is reflected downwardly is emitted to a region where the optical lens 340 is not arranged, it may be reflected upwardly from the reflection sheet 200 that is arranged on the region. Since the opening 210 is defined in the reflection sheet 200 for inserting the optical lens 340 in the opening 210, the light that reaches the region where the opening 210 is provided is not reflected by the reflection sheet 200, but reaches the surface of the exposed PCB 3200. The light that is reflected from the surface of the PCB 3200 may be incident to the inside of the optical lens 340 through the lower groove 342 of the optical lens 340 that is positioned on the upper portion thereof or the bottom surface portion of the optical lens 340, and may be emitted to an outside through the side surface portion or the upper surface portion of the optical lens 340. However, the incident angle of the light, which is emitted from the LED chip 330 and directly reaches the surface of the PCB 3200 without passing through the optical lens 340, is limited, and as illustrated in FIG. 6, most of the lights may be emitted through the side surface portion of the optical lens 340 and may be finally directed to the upper side. Accordingly, a larger number of lights may be relatively concentrated on the upper portion where the LED chip 330 is positioned. When the light is concentrated in a specific position or in a specific direction, light diffusion may be decreased. As described above, the reflection adjustment pattern 3240 may serve to improve the light diffusion.

As described above, the reflection adjustment pattern 3240 may include a material having different light reflection rate from the insulating coating layer 323, for example, a material having low light reflection rate. Accordingly, when the light reaches the reflection adjustment pattern 3240, the quantity of light that is reflected upwardly may be reduced. Accordingly, the light can be prevented from being concentrated on the upper portion of the LED chip 330.

Figure 7:
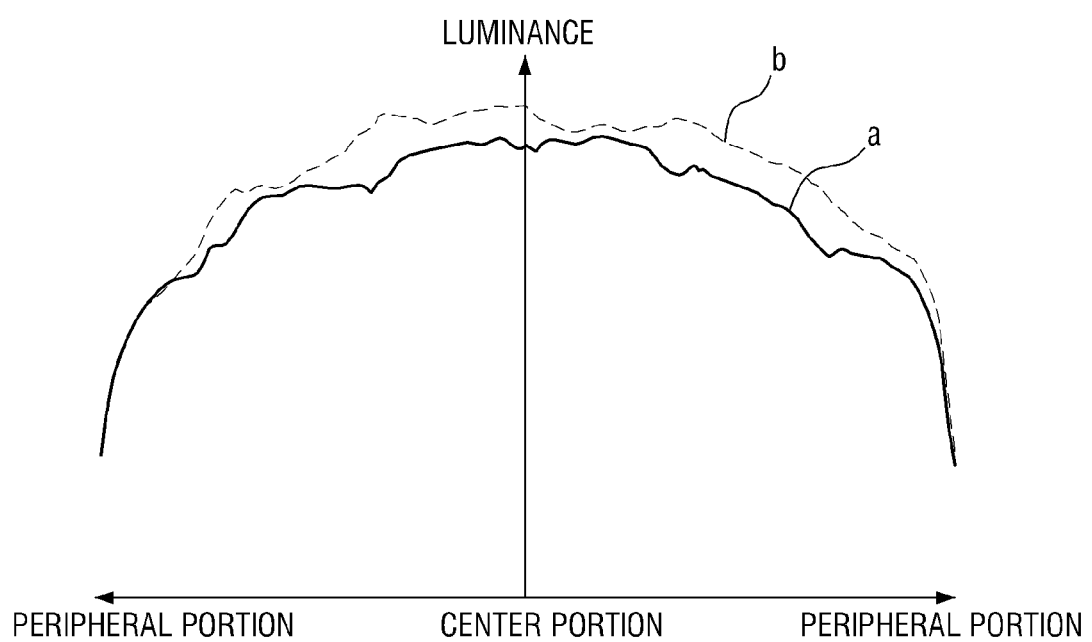
FIG. 7 is a graph illustrating luminance distribution depending on whether a reflection adjustment pattern is provided.

FIG. 7 is a graph illustrating luminance distribution depending on whether a reflection adjustment pattern is provided.

FIG. 7 illustrates both luminance distribution (b) in the case where the LED chip is mounted on the PCB on which the reflection adjustment pattern is not provided and the optical lens is arranged thereon and luminance distribution (a) in the case where the LED chip is mounted on the PCB on which the reflection adjustment pattern as shown in FIG. 5 is provided. In an exemplary embodiment, the surface of the PCB (insulating coating layer 323) is provided as white, and the reflection adjustment pattern is provided as black silk pattern having a relatively low reflection rate.

Referring to FIG. 7, in a case (b) where the reflection adjustment is not provided and in a case (a) where the reflection adjustment pattern is provided, the center portion has high luminance, and the peripheral portion has reduced luminance. In the case (b) where the reflection adjustment is not provided, the overall luminance becomes higher than the overall luminance in the case (a) where the reflection adjustment pattern is provided. However, such a luminance difference appears obviously in the center portion where the LED chip is positioned, and the luminance difference in the peripheral portion of the LED chip becomes almost zero or relatively small. Accordingly, it can be known that the reflection adjustment pattern improves the diffusion of the light distribution.

When the reflection adjustment pattern 3240 adopts a material having a different color that is not black, it becomes possible to control the color coordinates and color purity of the emitted light. In an exemplary embodiment, when the reflection adjustment pattern 3240 includes a material of blue type, such as blue, dark blue, or cyan in a state where there is a large amount of red or yellow type light through analysis of the spectrum of the emitted light, the emission amount of red or yellow type light is relatively reduced, and the blue type color is reinforced to improve the color purity.

The reflection adjustment pattern of various shapes and colors can control the diffusion and color purity of the light that is emitted from the LED chip. The detailed exemplary embodiments will be described through various embodiments.

Figure 8:
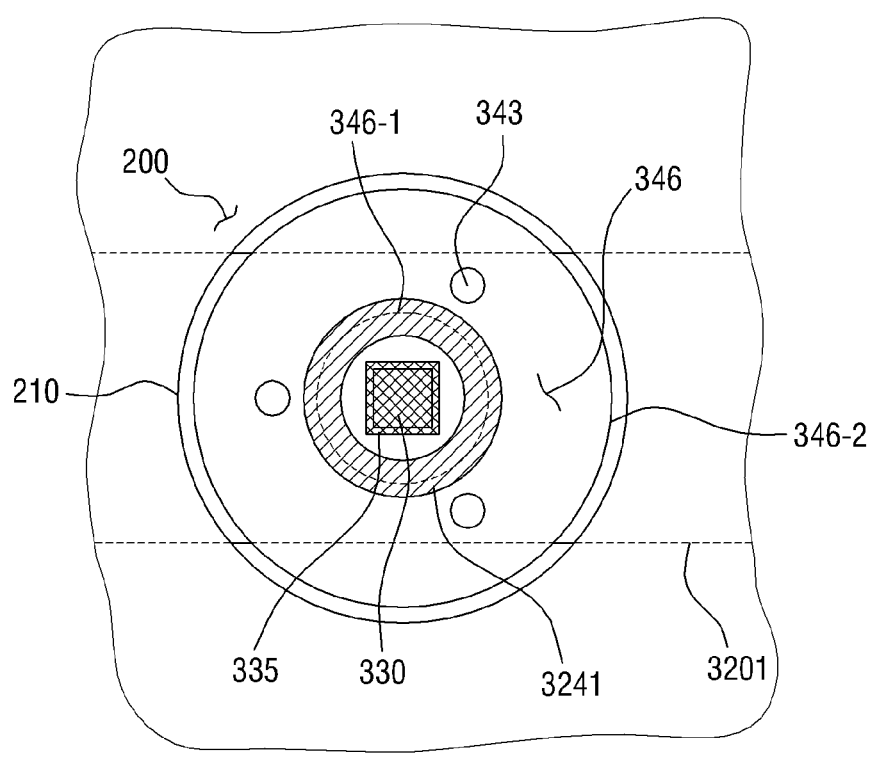
FIG. 8 is a plan view of another exemplary embodiment of a light source module of a display device according to the invention.

FIG. 8 is a plan view of a light source module of a display device according to another embodiment of the invention.

Referring to FIG. 8, according to the illustrated exemplary embodiment, a reflection adjustment pattern 3241 of a PCB 3201 is outwardly spaced apart from an LED chip 330 in the same manner as in the exemplary embodiment of FIG. 3, but the illustrated exemplary embodiment is different from the exemplary embodiment of FIG. 3 on the point that the reflection adjustment pattern 3241 is provided to extend up to a lower portion of a bottom surface portion 346 of the optical lens 340 through an inner corner 346_1 of the bottom surface portion 346 of the optical lens 340 in a plan view. Accordingly, the inner corner 346_1 of the bottom surface portion 346 of the optical lens 340 may be arranged to overlap the reflection adjustment pattern 3241 in a plan view, and an outer circumference of the reflection adjustment pattern 3241 may be positioned below the bottom surface portion 346 of the optical lens 340. There is not a gap space between the inner corner 346_1 of the bottom surface portion 346 of the optical lens 340 and the reflection adjustment pattern 3241.

In the illustrated exemplary embodiment, the outer circumference of the reflection adjustment pattern 3241 is spaced apart from the outer corner 346_2 of the bottom surface portion 346 of the optical lens 340. However, the width of the reflection adjustment pattern 3241 may be further extended and the reflection adjustment pattern 3241 may be further adjacent to an outer corner 346_2 of the bottom surface portion 346 of the optical lens 340.

In the illustrated exemplary embodiment, since the reflection adjustment pattern 3241 is extended up to the lower portion of the bottom surface portion 346 of the optical lens 340, it can control the reflection efficiency even with respect to the light that is incident to the lower portion of the bottom surface portion 346 of the optical lens 340.

Figure 9:
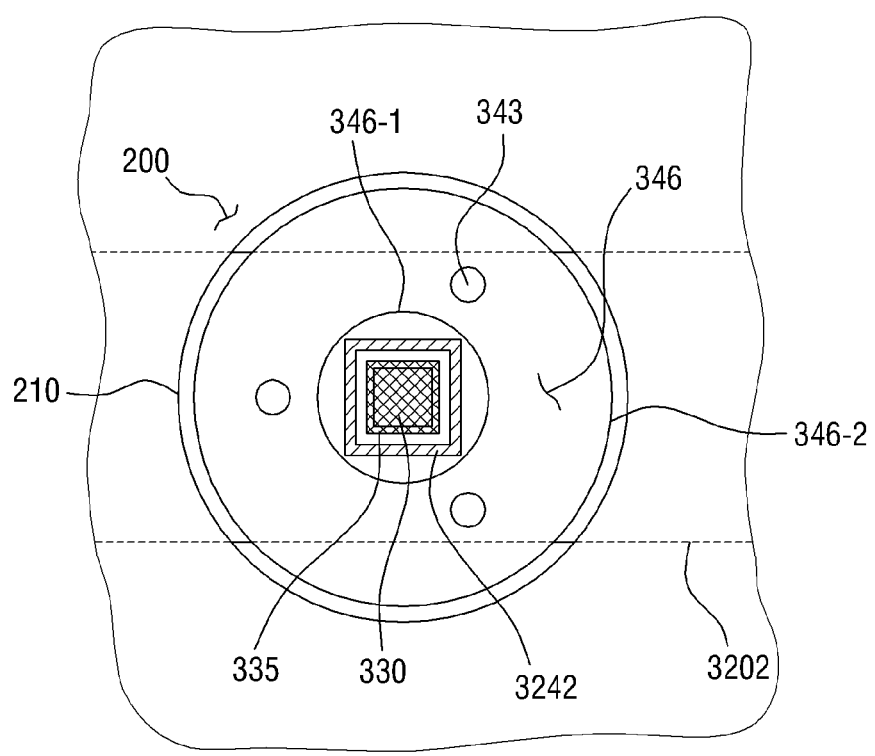
FIG. 9 is a plan view of another exemplary embodiment of a light source module of a display device according to the invention.

FIG. 9 is a plan view of a light source module of a display device according to another embodiment of the invention.

In an illustrated exemplary embodiment of FIG. 9, a reflection adjustment pattern 3242 of a PCB 3202 may be in a rectangular shape rather than a circular shape. Referring to FIG. 9, the rectangular-shaped reflection adjustment pattern 3242 may surround the periphery of an LED chip (or LED chip mount portion) 330 and may be spaced apart from the LED chip 330 by a predetermined distance. The LED chip 330 may be provided in a rectangular shape, and in this case, the distances by which the reflection adjustment pattern 3242 is spaced apart from the respective sides of the LED chip 330 may be equal to each other. The widths of the reflection adjustment pattern 3242 may be equal to each other on the respective sides.

Figure 10:
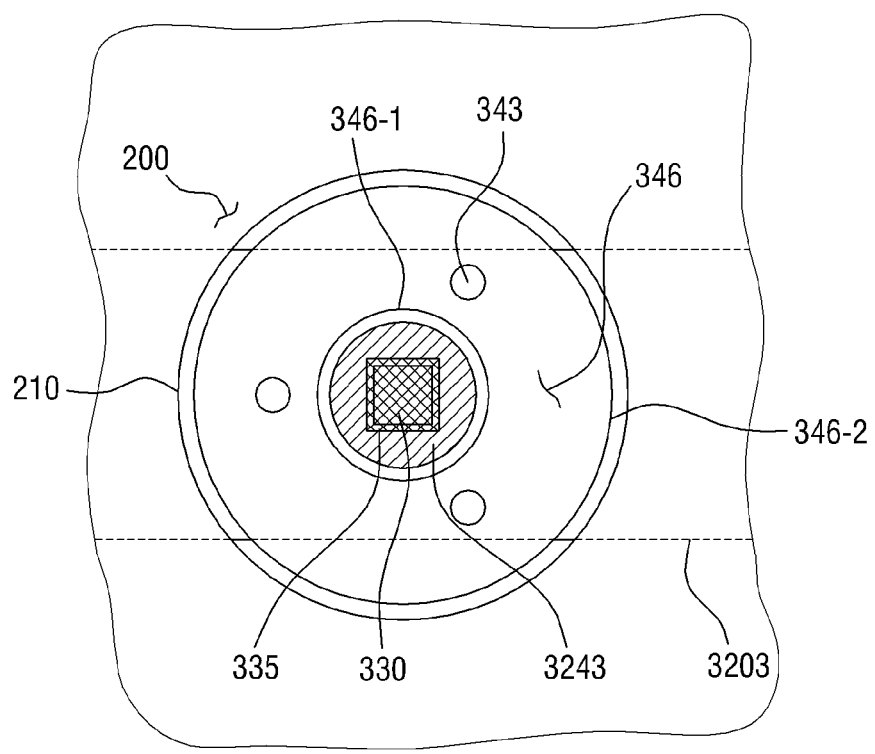
FIG. 10 is a plan view of another exemplary embodiment of a light source module of a display device according to the invention.
Figure 11:
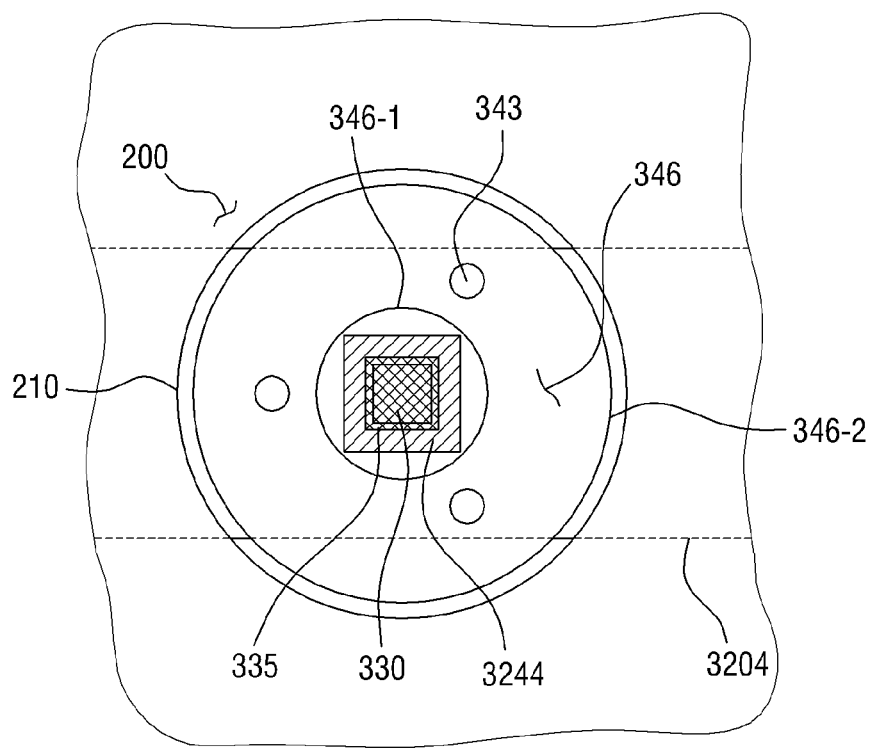
FIG. 11 is a plan view of another exemplary embodiment of a light source module of a display device according to the invention.

FIGS. 10 and 11 are plan views of a light source module of a display device according to another embodiment of the invention.

In an illustrated exemplary embodiment of FIG. 10, a reflection adjustment pattern 3243 of a PCB 3203 is provided to have a circular outer circumference, and an inner circumference of the reflection adjustment pattern 3243 comes in contact with an LED chip 330. That is, the shape of the inner circumference of the reflection adjustment pattern 3243 may be a rectangle. Since the reflection adjustment pattern 3243 and the LED chip 330 come in contact with each other without being spaced apart from each other, an insulating coating layer 323 is not exposed between the reflection adjustment pattern 3243 and the LED chip 330.

In an illustrated exemplary embodiment of FIG. 11, a reflection adjustment pattern 3244 of a PCB 3204 is provided to have a rectangular outer circumference, and an inner circumference of the reflection adjustment pattern 3244 comes in contact with an LED chip 330. Since the reflection adjustment pattern 3244 and the LED chip 330 come in contact with each other without being spaced apart from each other, an insulating coating layer 323 is not exposed between the reflection adjustment pattern 3244 and the LED chip 330.

Figure 12:
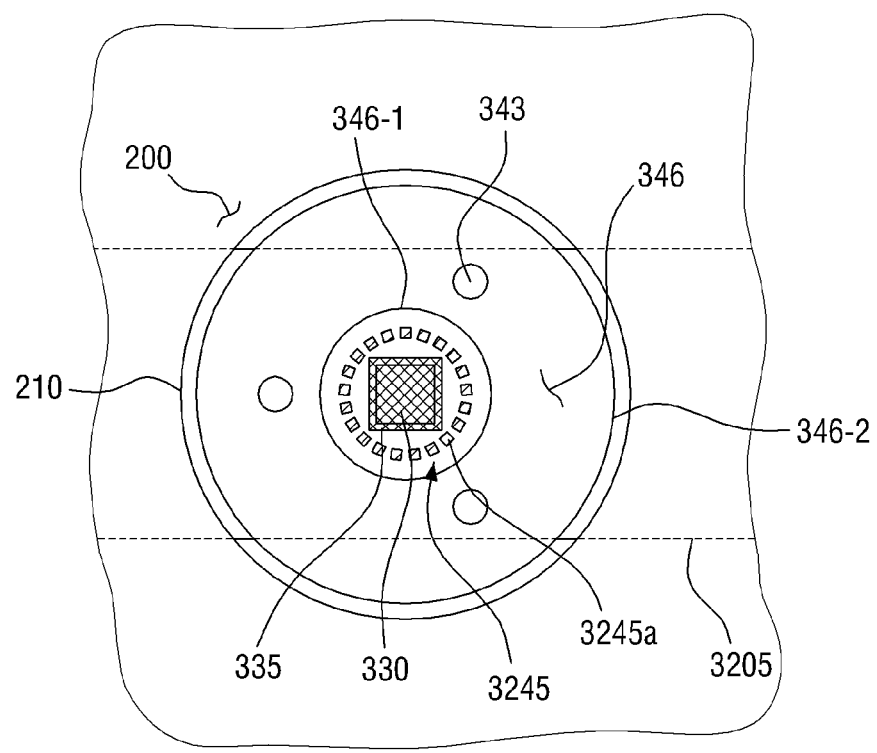
FIG. 12 is a plan view of another exemplary embodiment of a light source module of a display device according to the invention.
Figure 13:
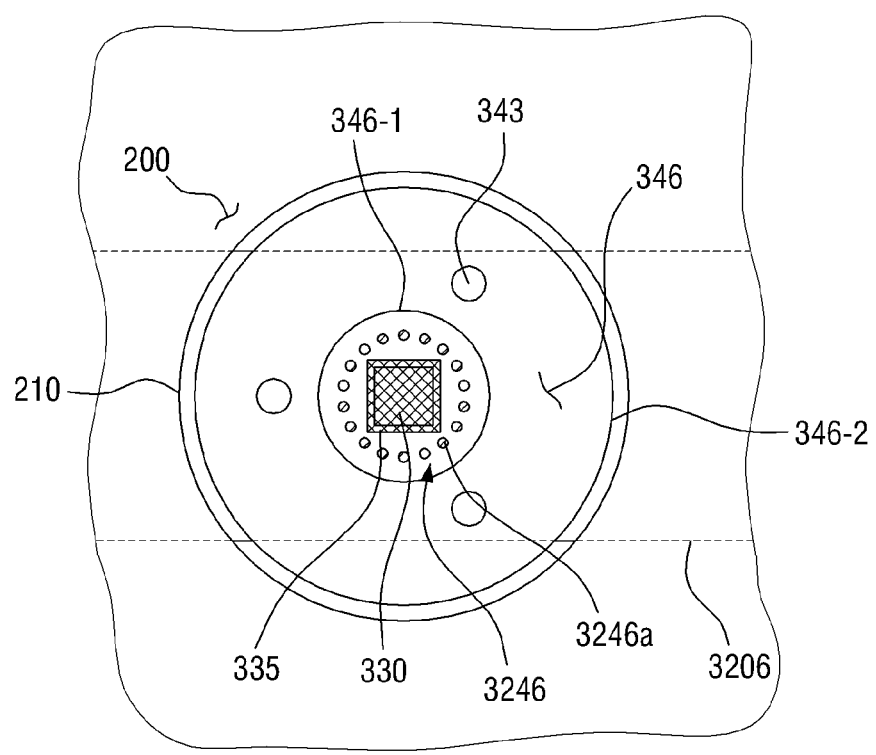
FIG. 13 is a plan view of another exemplary embodiment of a light source module of a display device according to the invention.

FIGS. 12 and 13 are plan views of a light source module of a display device according to another embodiment of the invention. In an illustrated exemplary embodiment of FIGS. 12 and 13, a reflection adjustment pattern can be separated into a plurality of sub-patterns.

Referring to FIG. 12, a reflection adjustment pattern 3245 of a PCB 3205 includes a plurality of sub-reflection adjustment patterns 3245a. The sub-reflection adjustment pattern 3245a may be in a substantially rectangular shape. In an exemplary embodiment, the respective sub-reflection adjustment patterns 3245a may be arranged at predetermined intervals along a virtual circle. The length of a side of the sub-reflection adjustment pattern 3245a may be larger than a gap distance between the sub-reflection adjustment patterns 3245a, but is not limited thereto. The sides of the respective sub-reflection adjustment patterns 3245a may be arranged in the tangential direction of the virtual circle. Accordingly, angles defined between the sides of the respective sub-reflection adjustment patterns 3245a may be different from each other. An insulating coating layer 323 may be exposed between the respective sub-reflection adjustment patterns 3245a. In the illustrated exemplary embodiment, the respective sub-reflection adjustment patterns 3245a are spaced apart from the LED chip 330. However, as shown in FIGS. 10 and 11, the respective sub-reflection adjustment patterns 3245a may be arranged adjacent to the LED chip 330.

In the illustrated exemplary embodiment, regions where the reflection adjustment patterns 3245 are provided in the vicinity of the LED chip 330 and regions where the reflection adjustment patterns 3245 are not provided are alternately arranged. Accordingly, the quantity of light that is emitted to and is reflected by the region where the reflection adjustment pattern 3245 is provided may be different from the quantity of light that is emitted to and is reflected by the region where the reflection adjustment pattern 3245 is not provided. However, since they are alternately arranged in repetition, the light adjustment effect can be generally averaged.

Referring to FIG. 13, a reflection adjustment pattern 3246 of a PCB 3206 according to the illustrated exemplary embodiment includes a plurality of sub-reflection adjustment pattern 3246a, but the illustrated exemplary embodiment is different from the exemplary embodiment of FIG. 12 on the point that the sub-reflection adjustment patterns 3246a are provided in a circular shape. Since the corresponding light modulation characteristics are substantially the same as those of the exemplary embodiment of FIG. 12, the duplicate explanation thereof will be omitted.

Figure 14:
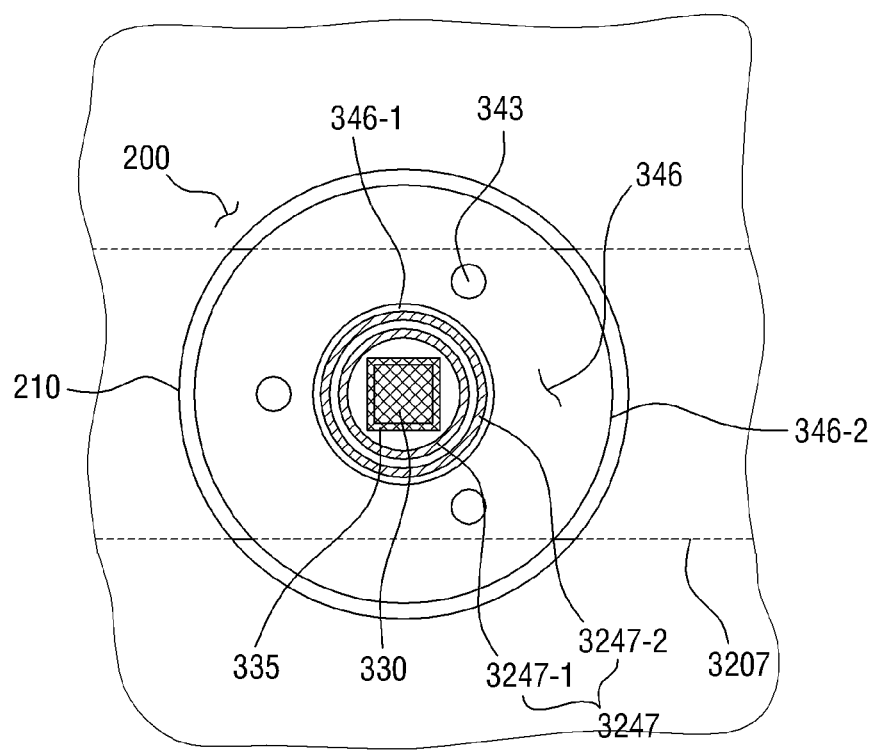
FIG. 14 is a plan view of another exemplary embodiment of a light source module of a display device according to the invention.
Figure 15:
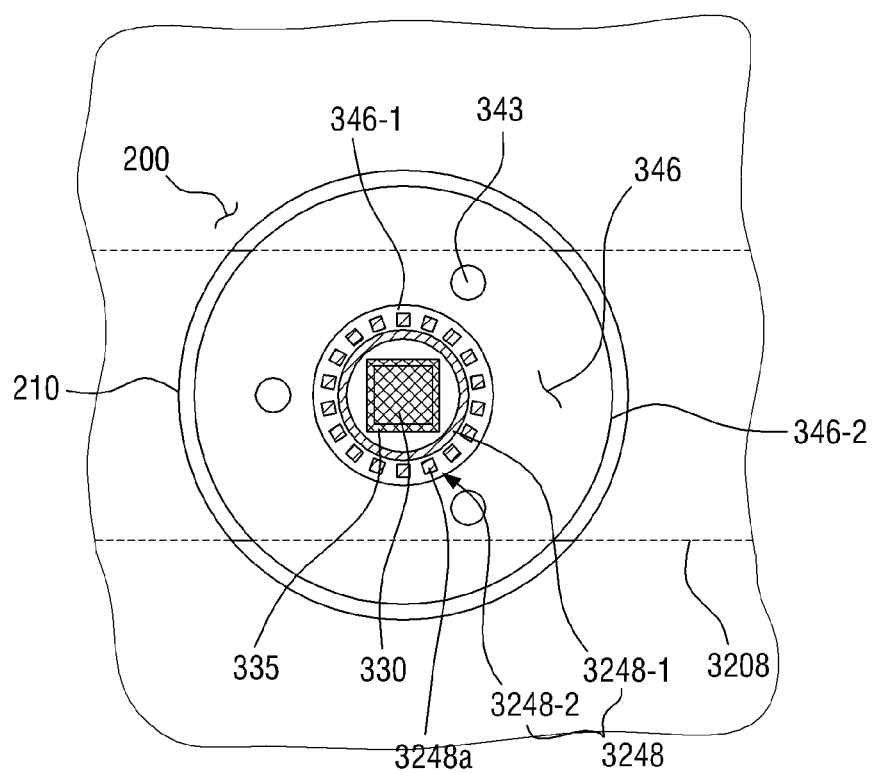
FIG. 15 is a plan view of another exemplary embodiment of a light source module of a display device according to the invention.
Figure 16:
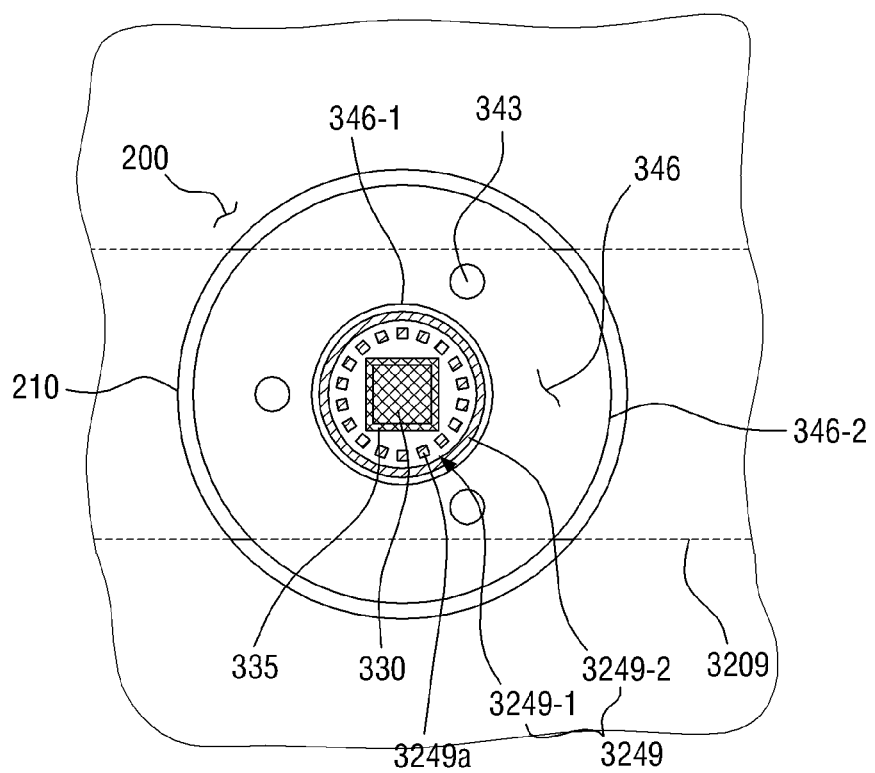
FIG. 16 is a plan view of another exemplary embodiment of a light source module of a display device according to the invention.

FIGS. 14 to 16 are plan views of a light source module of a display device according to another exemplary embodiment of the invention. FIGS. 14 to 16 exemplify a case where reflection adjustment patterns may be arranged in two or more lines.

Referring to FIG. 14, the illustrated exemplary embodiment is different from the exemplary embodiment of FIG. 3 on the point that a reflection adjustment pattern 3247 of a PCB 3207 includes a first reflection adjustment pattern member 3247_1 and a second reflection adjustment pattern member 3247_2 that is positioned on the outer side than the first reflection adjustment pattern member 3247_1. The first reflection adjustment pattern member 3247_1 and the second reflection adjustment pattern member 3247_2 may be in a circular band shape, but may be spaced apart from each other. In an exemplary embodiment, centers of the first reflection adjustment pattern member 3247_1 and the second reflection adjustment pattern member 3247_2 may be at the same position, and a radius of the inner circumference of the second reflection adjustment pattern member 3247_2 may be larger than a radius of the outer circumference of the first reflection adjustment pattern member 3247_1. An insulating coating layer 323 may be exposed between the first reflection adjustment pattern member 3247_1 and the second reflection adjustment pattern member 3247_2.

In the illustrated exemplary embodiment, in accordance with distances measured from the LED chip 330, the reflection adjustment patterns are repeatedly arranged in the order of a section where the reflection adjustment pattern 3247 is not provided (between the LED chip 330 and the inner circumference of the first reflection adjustment pattern member 3247_1), a section where the reflection adjustment pattern 3247 is provided (first reflection adjustment pattern member 3247_1), a section where the reflection adjustment pattern 3247 is not provided (between the first reflection adjustment pattern member 3247_1 and the second reflection adjustment pattern member 3247_2), a section where the reflection adjustment pattern 3247 is provided (second reflection adjustment pattern member 3247_2), and a section where the reflection adjustment pattern 3247 is not provided (outside of the second reflection adjustment pattern member 3247_2). Accordingly, the reflection rate according to the position can be adjusted more minutely.

FIGS. 15 and 16 exemplify that at least one of the first reflection adjustment pattern member and the second reflection adjustment pattern member includes sub-reflection adjustment patterns. In an illustrated exemplary embodiment of FIG. 15, the second reflection adjustment pattern member 3248_2, which is positioned on the outside in the reflection adjustment pattern 3248 of the PCB 3208, includes a plurality of sub-reflection adjustment patterns 3248a, and FIG. 16 exemplarily illustrates a case where the first reflection adjustment pattern member 3249_1, which is positioned on the inside in the reflection adjustment pattern 3249 of the PCB 3209, includes a plurality of sub-reflection adjustment patterns 3249a. In the exemplary embodiments, the first reflection adjustment pattern member 3248_1 of FIG. 15 and the second reflection adjustment pattern member 3249_2 of FIG. 16 are provided in a continuous circular band shape. However, the invention is not limited thereto, and the first reflection adjustment pattern member 3248_1 and the second reflection adjustment pattern member 3249_2 may also include a plurality of sub-reflection adjustment pattern.

Figure 17:
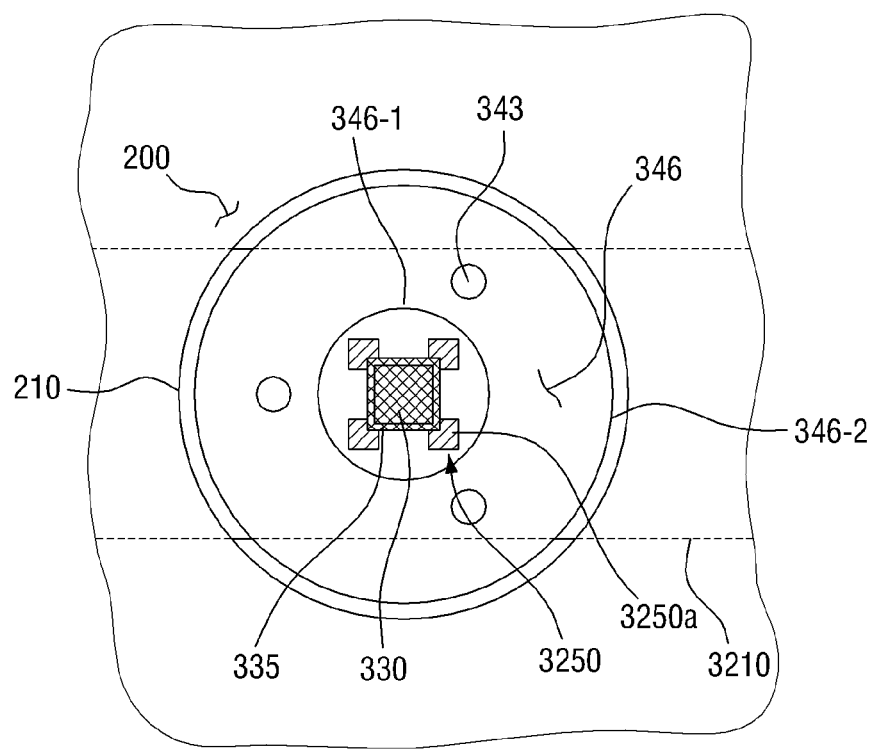
FIG. 17 is a plan view of another exemplary embodiment of a light source module of a display device according to the invention.
Figure 18:
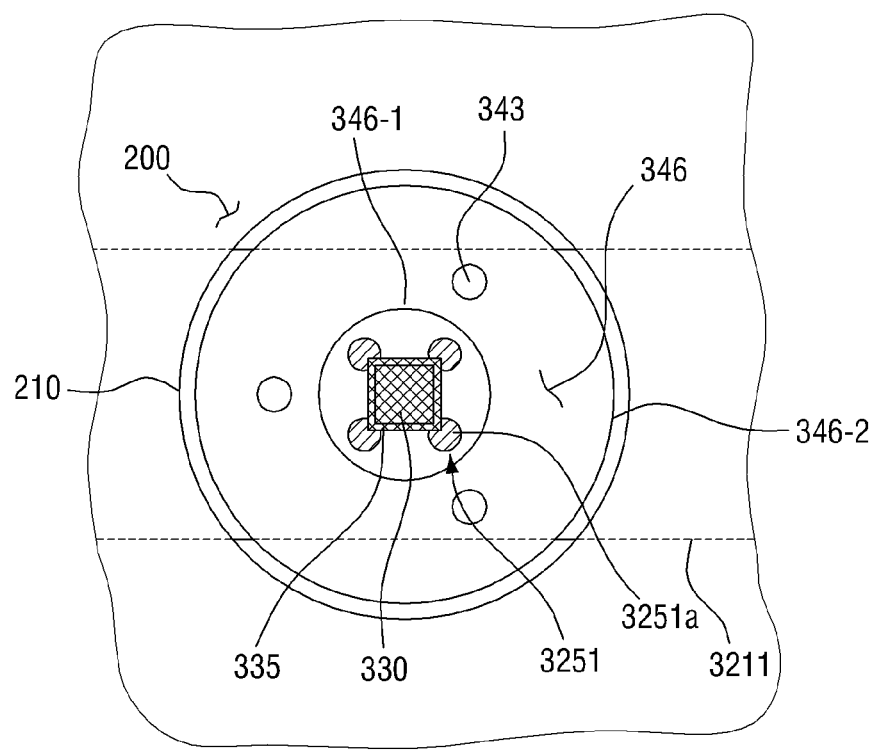
FIG. 18 is a plan view of another exemplary embodiment of a light source module of a display device according to the invention.

FIGS. 17 and 18 are plan views of a light source module of a display device according to another embodiment of the invention.

Referring to FIG. 17, a reflection adjustment pattern 3250 of a PCB 3210 according to the illustrated exemplary embodiment includes four sub-reflection adjustment patterns 3250a that are spaced apart from each other. The respective sub-reflection adjustment patterns 3250a are arranged adjacent to corners of a rectangular LED chip 330. The outer circumference of the sub-reflection adjustment pattern 3250a may be substantially in a rectangular shape. However, corner portions of the adjustment pattern 3250a that is positioned on the side of the LED chip 330 may overlap the LED chip 330 to be omitted. Since the respective sub-reflection adjustment pattern 3250a and the LED chip 330 come in contact with each other without being separated from each other, an insulating coating layer 323 may not be provided between the reflection adjustment pattern 3250a and the LED chip 330.

In the illustrated exemplary embodiment, since the reflection adjustment pattern 3250 is provided at the corner portions of the LED chip 330, the reflection rates at these portions are selectively adjusted. When the quantity of light that is emitted downwardly from the corner of the LED chip 330 is different from the quantity of light at other regions, the illustrated exemplary embodiment may be applied to perform the selective adjustment.

Referring to FIG. 18, a reflection adjustment pattern 3251 of a PCB 3211 according to the illustrated exemplary embodiment includes four sub-reflection adjustment patterns 3251a that are arranged adjacent to corners of an LED chip 330 in the same manner as the exemplary embodiment of FIG. 17. However, the illustrated exemplary embodiment is different from the exemplary embodiment of FIG. 17 on the point that the sub-reflection adjustment patterns 3251a are in a circular shape. In the illustrated exemplary embodiment, portions that are positioned on the side of the LED chip 330 in the circle may overlap the LED chip 330 to be omitted.

In concluding the detailed description, those skilled in the art will appreciate that many variations and modifications can be made to the preferred embodiments without substantially departing from the principles of the invention. Therefore, the disclosed preferred embodiments of the invention are used in a generic and descriptive sense only and not for purposes of limitation.

What is claimed is:

1. A light source module comprising:
a printed circuit board including:
a wiring layer,
an insulating coating layer disposed on the wiring layer, and
a reflection adjustment pattern disposed on the insulating coating layer and having reflection characteristics which are different from reflection characteristics of the insulating coating layer;
a light emitting chip mounted on the printed circuit board; and
an optical lens arranged on an upper portion of the light emitting chip and fixed to the printed circuit board,
wherein the reflection adjustment pattern comprises a plurality of sub-reflection adjustment patterns which are spaced apart from each other, and the respective sub-reflection adjustment patterns contact corners of the light emitting chip.

2. The light source module of claim 1, wherein
a lower groove is defined in a center portion of the optical lens and a bottom surface portion of the optical lens is positioned around the lower groove, and
the reflection adjustment pattern is positioned on an inner side of a corner of an inside of the bottom surface portion of the optical lens.

3. The light source module of claim 1, wherein the reflection adjustment pattern has a reflection rate which is lower than a reflection rate of the insulating coating layer.

4. The light source module of claim 1, wherein the reflection adjustment pattern has a color which is different from a color of the insulating coating layer.

5. The light source module of claim 4, wherein a surface of the insulating coating layer is white, and a surface of the reflection adjustment pattern is black, blue, dark blue, or bluish green.

6. A backlight assembly comprising:
a receptacle;
a printed circuit board arranged on the receptacle and including:
a wiring layer,
an insulating coating layer disposed on the wiring layer, and
a reflection adjustment pattern disposed on the insulating coating layer and having reflection characteristics which are different from reflection characteristics of the insulating coating layer;
a light emitting chip mounted on the printed circuit board;
an optical lens arranged on an upper portion of the light emitting chip and fixed to the printed circuit board;
a reflection sheet arranged on an upper portion of the receptacle; and
an opening defined in the reflection sheet and into which the optical lens is inserted,
wherein the reflection adjustment pattern comprises a plurality of sub-reflection adjustment patterns which are spaced apart from each other, and the respective sub-reflection adjustment patterns contact corners of the light emitting chip.

7. The backlight assembly of claim 6, wherein the printed circuit board is provided in a bar type.

8. The backlight assembly of claim 6, wherein the reflection adjustment pattern has a reflection rate which is lower than a reflection rate of the insulating coating layer.

9. The backlight assembly of claim 6, wherein the reflection adjustment pattern has a color which is different from a color of the insulating coating layer.

10. A display device comprising:
a receptacle;
a printed circuit board arranged on the receptacle and including a wiring layer, an insulating coating layer disposed on the wiring layer, and a reflection adjustment pattern disposed on the insulating coating layer and having reflection characteristics which are different from reflection characteristics of the insulating coating layer;
a light emitting chip mounted on the printed circuit board;
an optical lens arranged on an upper portion of the light emitting chip and fixed to the printed circuit board;
a reflection sheet arranged on an upper portion of the receptacle;
an opening defined in the reflection sheet and into which the optical lens is inserted;
an optical sheet arranged on an upper portion of the reflection sheet; and
a display panel arranged on an upper portion of the optical sheet,
wherein the reflection adjustment pattern comprises a plurality of sub-reflection adjustment patterns which are spaced apart from each other, and the respective sub-reflection adjustment patterns contact corners of the light emitting chip.

11. The display device of claim 10, wherein the printed circuit board is disposed in a bar type.

\* \* \* \* \*